(12) United States Patent
Kim (10) Patent No.: US 7,982,517 B2
(45) Date of Patent: Jul. 19, 2011

(54) DELAY LINE

(75) Inventor: Kyung-Hoon Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 43 days.

(21) Appl. No.: 12/627,415

(22) Filed: Nov. 30, 2009

(65) Prior Publication Data

US 2011/0001537 A1    Jan. 6, 2011

(30) Foreign Application Priority Data

Jul. 3, 2009 (KR) .................. 10-2009-0060672

(51) Int. Cl.
*H03H 11/26* (2006.01)

(52) U.S. Cl. ........................ 327/278; 327/276

(58) Field of Classification Search .............. None
See application file for complete search history.

(56) References Cited

U.S. PATENT DOCUMENTS 6,879,200 B2* 4/2005 Komura et al. ............. 327/278
7,417,478 B2* 8/2008 Kim et al. .................... 327/158

* cited by examiner

*Primary Examiner* — An T Luu
(74) *Attorney, Agent, or Firm* — IP & T Group LLP (57) ABSTRACT

A delay line includes a delay amount adjusting unit configured to adjust a delay amount of an input signal in response to a first delay control code, and a delay unit configured to determine a number of first delay blocks having a delay amount with a first variation width and a number of second delay blocks having a delay amount with a second variation width in response to a second delay control code, wherein the delay amount with the first variation width and the delay amount with the second variation width are determined by the delay amount adjusting unit and the first and second variation widths correspond to a level change of a power supply.

35 Claims, 4 Drawing Sheets

FIG. 4B

DELAY LINE

CROSS-REFERENCE TO RELATED APPLICATIONS

The present application claims priority of Korean patent application number 10-2009-0060672, filed on Jul. 3, 2009, which is incorporated by reference in its entirety.

BACKGROUND OF THE INVENTION

Exemplary embodiments of the present invention relate to a delay line, and more particularly, to a delay line for a semiconductor device for delaying an input signal.

A synchronous semiconductor device including a Double Data Rate Synchronous Dynamic Random Access Memory (DDR SDRAM) transfers data to external devices using an internal clock, which is synchronized with an external clock inputted from an external device, e.g., a memory controller.

In order to stably transfer data between a memory cell and an external device, time synchronization between and the data outputted from the memory cell and an external clock, which is applied from the external device to the memory cell is important.

The data outputted from the memory cell is synchronized with an internal clock. The internal clock is synchronized with the external clock when the external clock is applied to the memory cell. But, the internal clock is delayed through elements of the memory cell, and thus, the internal clock is not synchronized with the external clock when the data is outputted from the memory cell. That is, the data is not synchronized with the external clock.

Accordingly, in order to stably transfer data between the memory cell and the external device, the internal clock should be synchronized with the external clock by compensating the internal clock for a data bus time so that a delayed internal clock is correctly positioned on an edge or a center of the external clock applied from the external device.

Herein, the internal clock is a delayed clock of an external clock applied from the external device, and the external clock is delayed through a delay circuit, which replicates a delay caused by elements of the memory cell. Because a delay amount of the delay circuit is not variable, a phase of the internal clock is further delayed until the internal clock is synchronized with the external clock.

That is, because a phase difference between the internal clock and the external clock may not be calculated in advance, and may be variable according to an operation condition of the memory cell, the internal clock is delayed through the delay circuit of which a delay amount is varied in response to a control signal in order to correctly synchronize the internal clock with the external clock.

Moreover, in the case of a worst operation condition of the memory cell, when a phase difference between the internal clock and the external clock is one clock cycle 1tck, the internal clock must be delayed through a delay circuit having a large variable delay amount in response to a control signal to synchronize the external clock with the internal clock.

Meanwhile, since the replicated/modeled delay amount (hereinafter, delay amount) of the delay circuit which replicates a delay of the memory is not a variable value, theoretically, the replicated delay amount is different from a real delay amount in a real memory device because circuits may have a variable delay amount (e.g., an input buffer circuit or an output buffer circuit which buffers input/output signals) that depend on Process, Voltage, and Temperature (PVT) variation.

The difference between the replicated delay amount and the real delay amount is caused by the variations of the real delay amount based on the PVT variation. Accordingly, in order to compensate for this difference, a delay line having the modeled delay amount uses elements (e.g., a resistor or a capacitor), insensitive to the PVT variation, even though the real delay amount is determined by an operation of a CMOS transistor having a different characteristic than a resistor or capacitor.

However, if elements having different characteristics are used, because a variation width of an absolute delay amount depending on a level change of a power supply voltage VDD is different for each element, it is difficult to match the modeled/replicated delay amount with the real delay amount by a variation of the absolute delay amount.

Figure 1:
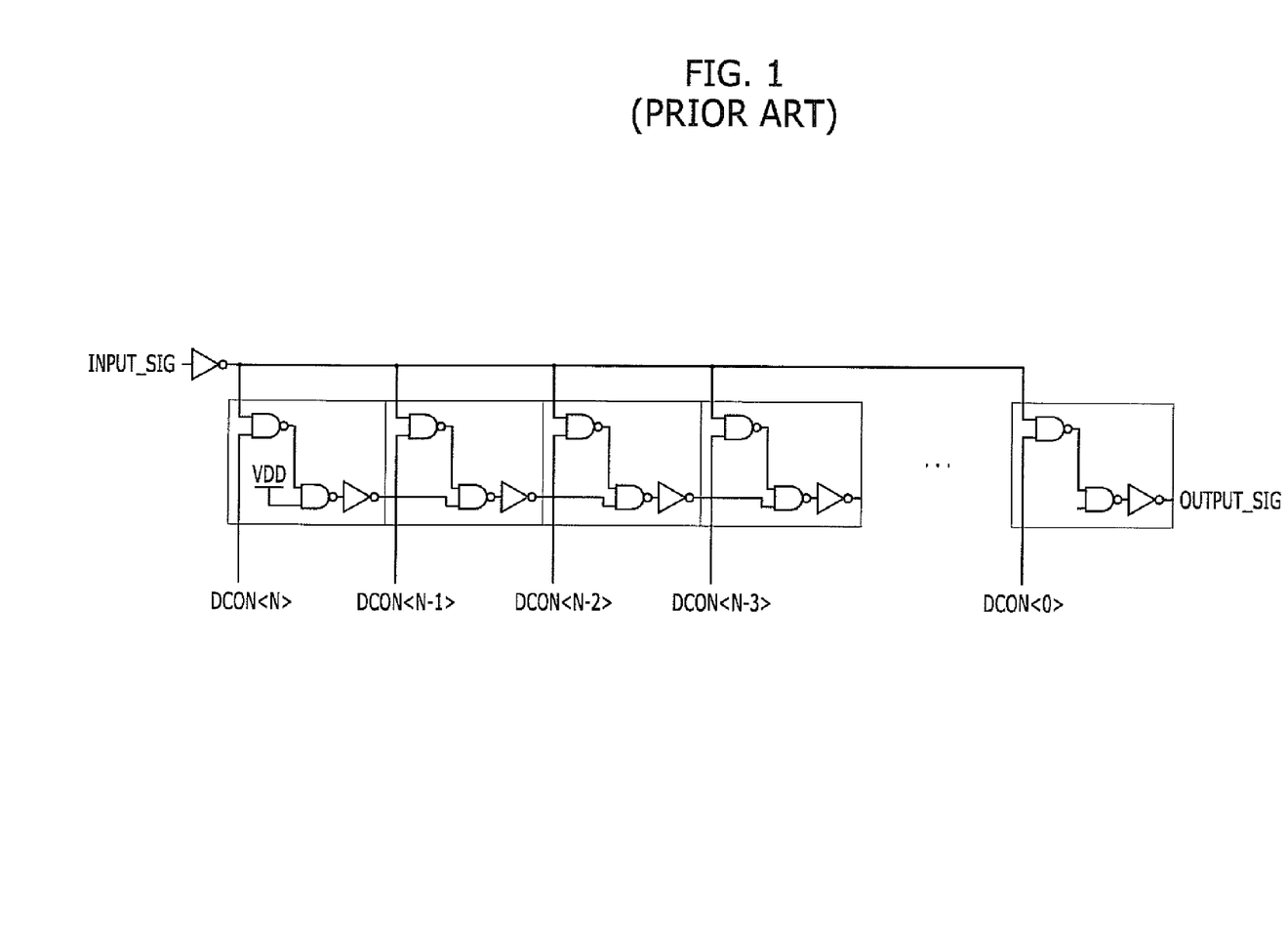
FIG. 1 is a conventional delay circuit.

That is, as shown in FIG. 1, because a conventional delay circuit performs a variation of a delay amount in response to control signals DCON<0:N>, but does not compensate for the change of the delay amount depending on the change of the power supply voltage VDD, it does not accurately match the replicated delay amount with the real delay amount.

This problem may occur in the conventional semiconductor devices, where the power supply VDD has an operation voltage range from 1.8V to 1.2V.

SUMMARY OF THE INVENTION

In accordance with an aspect of the present application, there is provided a delay line, which includes a delay amount adjusting unit configured to adjust a delay amount of an input signal in response to a first delay control code, and a delay unit configured to determine a number of first delay blocks having a delay amount of a first variation width and a number of second delay blocks having a delay amount of a second variation width in response to a second delay control code, wherein the delay amount of the first variation width and the delay amount of the second variation width are determined by the delay amount adjusting unit and the first and second variation widths correspond to a level change of a power supply.

The delay amount adjusting unit may be configured to increase the delay amount of the input signal in response to an increase of a value of the first delay control code, and decrease the delay amount of the input signal in response to a decrease of the value of the first delay control code.

The first delay control code may have a plurality of bits collectively forming the value, and the increase of the value corresponds to a change of a more significant bit of the plurality of bits to '1' and the remaining bits of the plurality of bits to '0'.

Further, the decrease of the value corresponds to a change of a less significant bit of the plurality of bits to '1' and the remaining bits of the plurality of bits to '0'.

The delay unit may increase the number of the first delay blocks and decrease the number of the second delay blocks through which the input signal passes in response to an increase of a second value of the second delay control code.

The delay unit may decrease the number of the first delay blocks and may increase the number of the second delay blocks through which the input signal passes in response to a decrease of the second value of the second delay control code.

The second delay control code may have a plurality of bits collectively forming the second value, and the increase of the second value corresponds to a change of a more significant bit of the plurality of bits to '1' and the remaining bits of the plurality of bits to '0'.

Further, the decrease of the second value corresponds to a change of a less significant bit of the plurality of bits to '1' and the remaining bits of the plurality of bits to '0'.

In accordance with another aspect of the present application, there is provided a delay line, which includes a delay amount adjusting unit configured to adjust a delay amount of an input signal in response to a first delay control code, a plurality of first delay blocks configured to have a delay amount with a first variation width for the input signal, a plurality of second delay blocks configured to have a delay amount with a second variation width for the input signal, wherein the first and second variation width correspond to a level change of a power supply voltage and the amount of the second variation width is greater than the amount of the first variation width, and a plurality of delay control blocks configured to determine a number of the first and second delay blocks through which the input signal passes in response to a second delay control code, wherein the delay amount with the first variation width and the delay amount with the second variation width are determined by the delay amount adjusting unit.

The delay amount adjusting unit may include a buffering block configured to buffer the input signal and output a buffered input signal, and a plurality of input signal transfer blocks configured to transfer the buffered input signal to the first delay blocks in response to each bit of the first delay control code.

Each of the input signal transfer blocks may include a NAND gate, which receives the buffered input signal and a bit of the first delay control code and performs a NAND logic operation.

Each of the first delay blocks may delay and output one of an output signal of a corresponding input signal transfer block and an output signal of a previous first delay block of the first delay blocks by a predetermined delay amount.

Each of the first delay blocks may include a fourth NAND gate configured to receive an output signal of the previous first delay block and an inverted signal of the second delay control code, and to perform a NAND logic operation, and a fifth NAND gate configured to receive an output signal of the corresponding input signal transfer block and an output signal of the fourth NAND gate, and to perform a NAND logic operation.

The delay control blocks may include a start delay controller configured to transfer the signal outputted from one of the input signal transfer blocks to one of a start first delay block of the first delay blocks and a start second delay block of the second delay blocks in response to a least significant bit of the second delay control code; a plurality of delay controllers configured to selectively transfer the output signal of the corresponding previous first delay block to the second delay block in response to a plurality of bits of the second delay control code, except for the least significant bit and a most significant bit, and an end delay controller configured to selectively transfer one of an output signal of one of the first delay blocks and an output signal of one of the second delay blocks in response to the most significant bit of the second delay code to an output terminal.

The start delay controller may include a sixth NAND gate, which receives the least significant bit of the second delay control code and the output signal of a third NAND gate, and performs a NAND logic operation.

Each of the delay controllers may include a seventh NAND gate, which receives the plurality of bits of the second delay control code, except for the least significant bit and the most significant bit, and the output signal of the corresponding previous first delay block, and performs a NAND logic operation.

The end delay controller may include an eighth NAND gate configured to receive the most significant bit of the second delay control code and the output signal of one of the first delay blocks, and to perform a NAND logic operation, a ninth NAND gate configured to receive the an output of the eighth NAND gate and the output signal of one of the second delay blocks, and to perform a NAND logic operation, and a second inverter configured to invert and output an output signal of the ninth NAND gate to an output terminal.

Each of the second delay blocks may delay and output an output signal of one of the delay control blocks or a second input signal by a predetermined delay amount.

If the output signals of the delay control blocks are received from the first delay blocks, each of the second delay blocks may delay and output the output signals of the delay control blocks by the predetermined delay amount, and if the output signals of the delay control blocks are not received from the first delay blocks, each of the second delay blocks may delay and output the second input signal by the predetermined delay amount.

Each of the second delay blocks may include a tenth NAND gate configured to receive the output signal of the delay control block and the second input signal, and perform a NAND logic operation; and a third inverter configured to invert an output signal of the tenth NAND gate.

The delay amount adjusting unit may increase the number of the first and second delay blocks and the delay control blocks through which the input signal passes in response to an increase of a value of the first delay control code, and may decrease the number of the first and second delay blocks and the delay control blocks through which the input signal passes in response to a decrease of the value of the first delay control code.

The first delay control code may have a plurality of bits collectively forming the value, and the increase of the value corresponds to a change of a more significant bit of the plurality of bits to '1' and the remaining bits of the plurality of bits to '0'.

Further, the decrease of the value corresponds to a change of a less significant bit of the plurality of bits to '1' and the remaining bits of the plurality of bits to '0'.

The number of the first delay blocks through which the input signal passes may increase and the number of the second delay block through which the input signal passes may decrease in response to the increase of a second value of the second delay control code.

The number of the first delay blocks through which the input signal passes may decrease and the number of the second delay blocks through which the input signal passes may increase in response to a decrease of the second value of the second delay control code.

The second delay control code may have a plurality of bits collectively forming the second value, and the increase of the second value corresponds to a change of a more significant bit of the plurality of bits to '1' and the remaining bits of the plurality of bits to '0'.

Further, the decrease of the second value corresponds to a change of a less significant bit of the plurality of bits to '1' and the remaining bits of the plurality of bits to '0'.

In accordance with another aspect of the present application, there is provided a delay line, which includes a first delay block configured to delay a first input signal inputted to a first signal input node of a delay unit by a first delay amount in response to a delay control code corresponding to the delay unit, and to transfer a first delayed input signal to a first signal input node of a next delay unit, a signal transfer block configured to transfer the first input signal of the first signal input node to a signal transfer node corresponding to the delay unit in response to the delay control code corresponding to the delay unit, and a second delay block configured to logically combine an output signal of the signal transfer block transferred to the signal transfer node with a second input signal of a second signal input node, to delay a logically combined signal by a second delay amount, and to transfer a second delayed input signal to a second signal input node of the next delay unit.

The first delay block may be configured to delay the first input signal inputted to the first signal input node of the delay unit by the first delay amount, and may transfer the first delayed input signal to the first signal input node of the next delay unit in response to an inactivation of the delay control code corresponding to the delay unit.

The first delay block may be configured to not transfer the first input signal inputted to the first signal input node of the delay unit in response to an activation of the delay control code corresponding to the delay unit.

The first delay block may include a second NAND gate configured to receive the first input signal inputted to the first signal input node and an inverted signal of the delay control code corresponding to the delay unit, and to perform a NAND logic operation, and a second inverter configured to invert an output signal of the second NAND gate and to transfer an inverted output signal to the first signal input node of the next delay unit.

The signal transfer block may be configured to transfer the first input signal of the first signal input node to the signal transfer node corresponding to the delay unit in response to the activation of the delay control code corresponding to the delay unit.

The signal transfer block may be configured to not transfer the first input signal of the first signal input node to the signal transfer node corresponding to the delay unit in response to the inactivation of the delay control code corresponding to the delay unit.

The signal transfer block may include a third NAND gate which receives the first input signal of the first signal input node of the delay unit and the delay control code corresponding to the delay unit, wherein the third NAND gate may perform a NAND logic operation, and outputs a result of the NAND logic operation as an output signal of the signal transfer block to the signal transfer node.

The second delay block may include a fourth NAND gate configured to receive the output signal of the signal transfer block and the second input signal, and to perform a NAND logic operation; and a third inverter configured to invert the output signal of the fourth NAND gate and to transfer an inverted signal to the second signal input node of the next delay unit.

DESCRIPTION OF SPECIFIC EMBODIMENTS

Exemplary embodiments of the present invention will be described below in more detail with reference to the accompanying drawings. The present application may, however, be embodied in different forms and should not be construed as limited to the embodiments set forth herein. Rather, these embodiments are provided so that this disclosure will be thorough and complete, and will fully convey the scope of the present invention to those skilled in the art. Throughout the application, like reference numerals refer to like parts throughout the various figures and embodiments of the present invention.

First Embodiment

Figure 2:
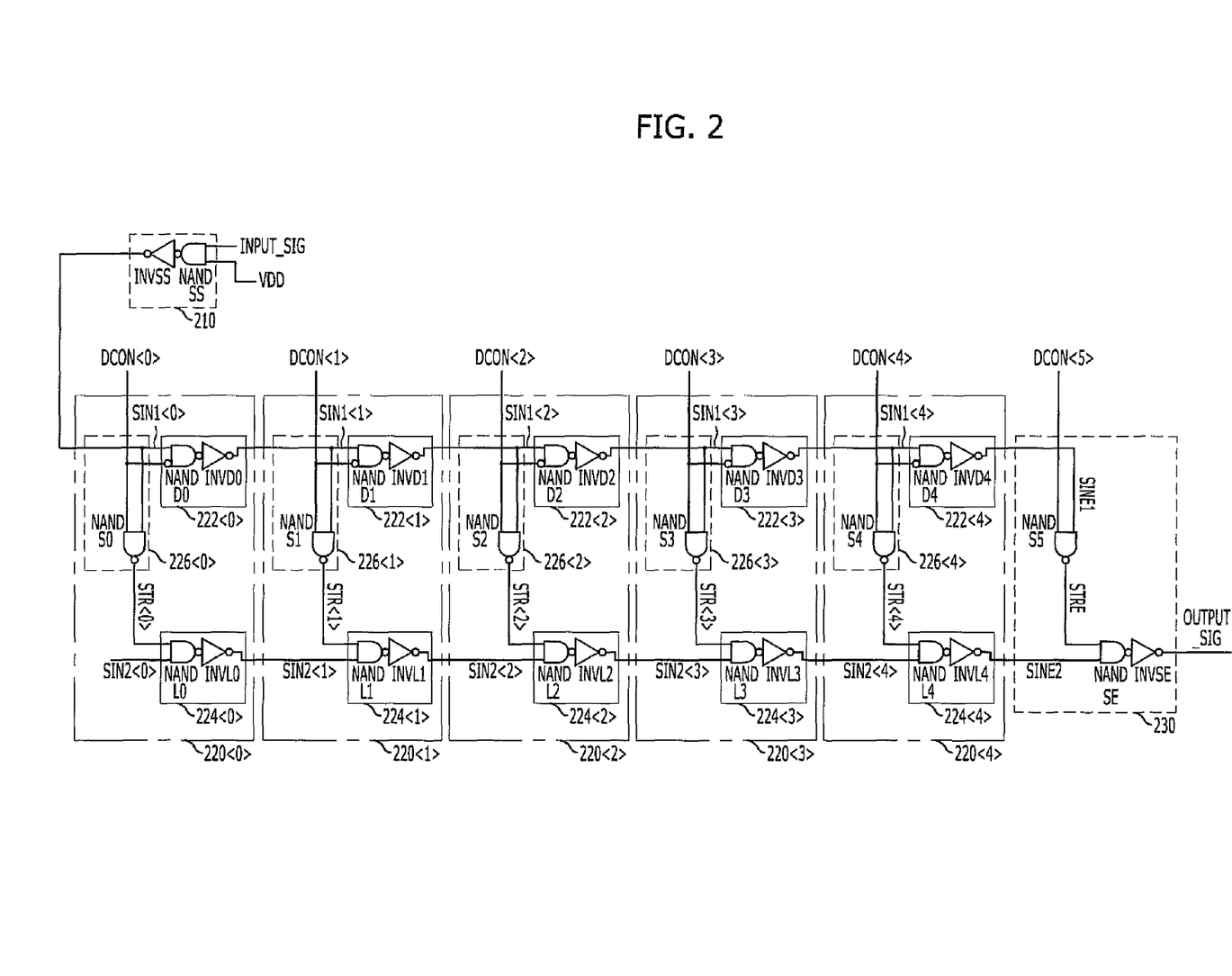
FIG. 2 is a circuit diagram illustrating a delay line in accordance with a first embodiment of the present application.

FIG. 2 is a circuit diagram illustrating a delay line in accordance with a first embodiment of the present application.

As shown in FIG. 2, the delay line in accordance with a first embodiment of the preset application includes a start delay control unit 210, delay units 220<0:4> (that is, delays units 220<0>, 220<1>, 220<2>, 220<3>, and 220<4>) and an end delay control unit 230.

The start delay control unit 210 includes a first NAND gate NANDSS and a first inverter INVSS, and is coupled to the delay unit 220<0>. The start delay control unit 210 buffers an input signal INPUT_SIG, and outputs a first input signal as a buffered input signal.

The first NAND gate NANDSS receives an input signal INPUT_SIG through a first input terminal and a power supply voltage VDD through a second input terminal, and performs a NAND logic operation. The first inverter INVSS inverts and outputs the output signal of the first NAND gate NANDSS.

Each delay unit 220<0:4> includes a first delay block 222<0:4>, a second delay block 224<0:4>, and a signal transfer block 226<0:4>.

The first delay blocks 222<0:4> delay first input signals inputted to a first signal input node SIN1<0:4> of the delay units 220<0:4> by a first delay amount in response to delay control codes DCON<0:4> corresponding to the delay units 220<0:4>. Further, the first delay blocks 222<0:3> transfer first delayed input signals to the first signal input nodes SIN1<1:4> of the delay units 220<1:4>, respectively. The first delay amount is determined by a level variation of a power supply voltage VDD.

The signal transfer blocks 226<0:4> transfers the first input signal of the first signal input nodes SIN1<0:4> to signal transfer nodes STR<0:4> corresponding to the delay units 220<0:4> in response to the delay control codes DCON<0:4>.

The second delay blocks 224<0:4> logically combine an output signal of the signal transfer blocks 226<0:4> transferred to the signal transfer nodes STR<0:4> with a second input signal of second signal input nodes SIN2<0:4>. The second delay blocks 224<0:3> delay a logically combined signal by a second delay amount, and transfer a second delayed input signal to second signal input nodes SIN2<1:4> of the corresponding subsequent delay units 220<1:4>, respectively. The second delay amount is determined by a level variation of a power supply voltage VDD and has a greater value than the first delay amount.

The end delay control unit 230 is coupled to the last delay unit 220<4>, and outputs a signal OUTPUT_SIG, based on the logic combination of the first delayed signal of the first delay block 222<4> and the second delayed signal of the second delay block 224<4>, to a delay signal output terminal.

Herein, the first delay blocks 222<0:4> delay the first input signals of the first signal input nodes SIN1<0:4> of the delay units 220<0:4> by the first delay amount. Further, the first delay blocks 222<0:3> transfer the first delayed signals to the first signal input nodes SIN1<1:4> of the delay units 220<1:4> in response to an inactivation of the delay control codes DCON<0:3> (i.e., delay control codes DCON<0:3> having a logic low level). Accordingly, the first delay blocks 222<0:3> do not transfer the first input signals of the first signal input nodes SIN1<0:3> of the delay units 220<0:3> to the first signal input nodes SIN1<1:4> of the delay units 220<1:4>, respectively, in response to an activation of the delay control codes DCON<0:3> (i.e., delay control codes DCON<0:3> having a logic high level).

In detail, the first delay blocks 222<0:4> each include a second NAND gate NANDD<0:4> and a second inverter INVD<0:4>.

The second NAND gates NANDD<0:4> receive the first input signals inputted to the first signal input nodes SIN1<0:4> and an inverted signal of the delay control codes DCON<0:4> corresponding to the delay units 220<0:4>, and perform a NAND logic operation.

The second inverters INVD<0:4> invert an output signal of the second NAND gates NANDD<0:4>. Further, the second inverters INVD<0:3> transfer the inverted output signals to the first signal input nodes SIN1<1:4> of the delay units 220<1:4>.

The signal transfer blocks 226<0:4> transfer the first input signals of the first signal input nodes SIN1<0:4> of delay units 220<0:4> to the signal transfer nodes STR<0:4> of the corresponding delay units 220<0:4> in response to the activation of the delay control codes DCON<0:4> (i.e., delay control codes DCON<0:4> having a logic high level). Accordingly, the signal transfer blocks 226<0:4> do not transfer the first input signals of the first signal input nodes SIN1<0:4> of the delay units 220<0:4> to the signal transfer nodes STR<0:4> of the corresponding delay units 220<0:4>, respectively, in response to the inactivation of the delay control codes DCON<0:4> (i.e., delay control codes DCON<0:4> having a logic low level).

In detail, the signal transfer blocks 226<0:4> each include a third NAND gate NANDS<0:4>. The third NAND gates NANDS<0:4> receive the first input signals of the first signal input nodes SIN1<0:4> of the delay units 220<0:4> and the delay control codes DCON<0:4> corresponding to the delay units 220<0:4>. The third NAND gates NANDS<0:4> perform a NAND logic operation, and output a result of the NAND logic operation as an output signal of the signal transfer units 226<0:4> to the signal transfer nodes STR<0:4>.

The second delay blocks 224<0:4> logically combine the output signals of the transfer units 226<0:4> with the second input signals inputted to the second signal input nodes SIN2<0:4>, and delay combined signals by a second delay amount. Further, second delay blocks 224<0:3> transfer second delayed signals to the second signal input nodes SIN2<1:4> of the next delay units 220<1:4>.

Hereinafter, a manner for combining the output signals of the transfer units 226<0:4> with the second input signals inputted to the second signal input nodes SIN2<0:4> of the corresponding delay unit will be described in detail as follows.

First, the second signal input node SIN2<0> of a first delay unit 220<0> is held to a transfer logic level, which represents a logic high level corresponding to a power supply voltage VDD in accordance with the first embodiment of the present application.

Therefore, a logic level of a signal outputted from the second delay block 224<0> of the first delay unit 220<0> is identical to a logic level of the delay control code DCON<0> of the first delay unit 220<0> because the second signal input node SIN2<0> of the first delay unit 220<0> has the transfer logic level.

That is, if the logic level of the signal control code DCON<0> of the first delay unit 220<0> is a logic high level, after a predetermined time corresponding to a second delay amount, the logic level of the signal outputted from the second delay block 224<0> of the first delay unit 220<0> is a logic high level. If the logic level of the signal control code DCON<0> of the first delay unit 220<0> is a logic low level, after a predetermined time corresponding to a second delay amount, the logic level of the signal outputted from the second delay block 224<0> of the first delay unit 220<0> is a logic low level.

For reference, as described above, if the second signal input nodes SIN2<0:4> of the delay units 220<0:4> have a transfer logic level (that is, a logic high level), the logic levels of the signals outputted from the second delay blocks 224<0:4> of the delay units 220<0:4> are identical to the logic levels of the signal transfer nodes STR<0:4> of the delay units 220<0:4>.

As described above, when the delay control codes DCON<0:4> corresponding to the delay units 220<0:4> are inactivated to a logic low level, the signal transfer blocks 226<0:4> do not transfer the first input signal on the first signal input nodes SIN1<0:4> of the delay units 220<0:4> to the signal transfer nodes STR<0:4> of the delay units 220<0:4>. When the signal transfer blocks 226<0:4> do not transfer the first input signal on the first signal input nodes SIN1<0:4> of the delay units 220<0:4> to the signal transfer nodes STR<0:4> of the delay units 220<0:4>, the logic level of the signal transfer nodes STR<0:4> corresponding to the delay units 220<0:4> becomes a transfer logic level.

Further, as described above, when the delay control codes DCON<0:4> corresponding to the delay units 220<0:4> are activated to a logic high level, the signal transfer blocks 226<0:4> transfer the first input signal on the first signal input nodes SIN1<0:4> of the delay units 220<0:4> to the signal transfer nodes STR<0:4> of the delay units 220<0:4> in response to the delay control codes DCON<0:4>. If the signal transfer blocks 226<0:4> transfer the first input signal on the first signal input nodes SIN1<0:4> of the delay units 220<0:4> to the signal transfer nodes STR<0:4> of the delay units 220<0:4>, the logic level of the signal transfer nodes STR<0:4> corresponding to the delay units 220<0:4> is inverted from the first input signal on the first signal input nodes SIN1<0:4>.

In another embodiment of the present application, if each of the signal transfer blocks 226<0:4> further includes an additional inverter (not shown), the logic level outputted from the signal transfer blocks 226<0:4> corresponding to the delay units 220<0:4> may become the logic level of the first signal input nodes SIN1<0:4>.

If the logic levels of both the second signal input nodes SIN2<0:4> and the signal transfer nodes STR<0:4> corresponding to the delay units 220<0:4> are the transfer logic levels, after a predetermined time corresponding to the second delay amount, the second delay blocks 224<0:3> control the second signal input nodes SIN2<1:4> of the next delay units 220<1:4> to have the transfer logic level.

If the logic levels of the second signal input nodes SIN2<0:4> corresponding to the delay units 220<0:4> are equal to the transfer logic level and the signal transfer nodes STR<0:4> corresponding to the delay units 220<0:4> are equal to the inverted logic level of the first signal input nodes SIN1<0:4>, after a predetermined time corresponding to the second delay amount, the second delay blocks 224<0:3> control the second signal input nodes SIN2<1:4> of the corresponding subsequent delay units 220<1:4> to have the inverted logic level of the first signal input nodes SIN1<0:3>.

In detail, each of the second delay blocks 224<0:4> includes a fourth NAND gate NANDL<0:4> and a third inverter INVL<0:4>. The fourth NAND gates NANDL<0:4> receive the output signal of the signal transfer blocks 226<0:4> through the first transfer nodes STR<0:4> as a first input node and the second input signal on the second signal input nodes SIN2<0:4> as a second input node, and performs a NAND logic operation. The third inverters INVL<0:4> invert the output signal of the fourth NAND gates NANDL<0:4>. Further, the third inverters INVL<0:3> transfer an inverted signal to the second signal input nodes SIN2<1:4> of the corresponding subsequent delay units 220<1:4>.

The end delay control unit 230 includes a fifth NAND gate NANDS5, a sixth NAND gate NANDSE, and a fourth inverter INVSE. The fifth NAND gate NANDS5 receives an uppermost bit DCON<5> of the delay control codes DCON<0:5> through a first input node and an output signal SINE1 of the first delay block 222<4> of the fifth delay unit 220<4> through a second input node. The fifth NAND gate NANDS5 also performs a NAND logic operation.

The sixth NAND gate NANDSE receives an output signal of the fifth NAND gate NANDS5 through a first input node and an output signal SINE2 of the second delay block 224<4> of the fifth delay unit 220<4> through a second input node, and performs a NAND logic operation.

The fourth inverter INVSE inverts and outputs a phase of a signal outputted from the sixth NAND gate NANDSE to an output terminal.

Figure 4A:
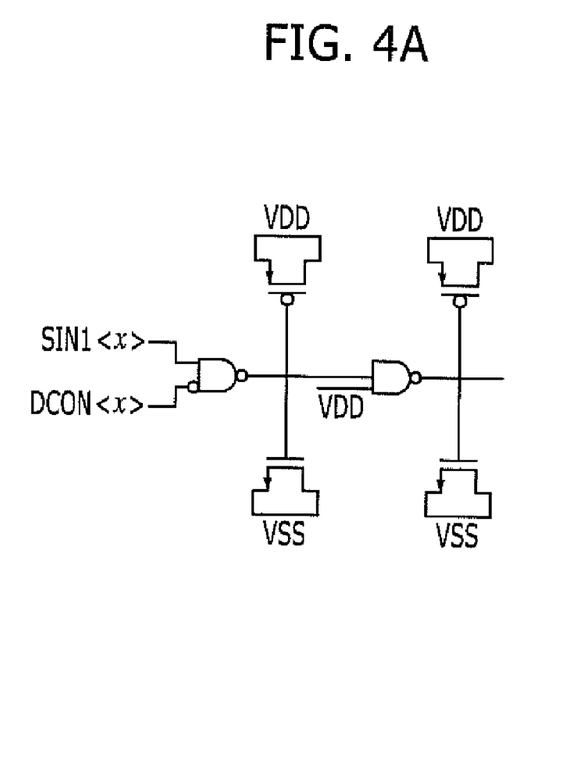
FIGS. 4A and 4B are circuit diagrams illustrating other delay units included in a delay line in accordance with additional embodiments of the present application.

For reference, a configuration of the first delay blocks 222<0:4> of the delay units 220<0:4> may be replaced by a configuration shown in FIG. 4A. That is, each of the second inverters INVD<0:4> of the first delay blocks 222<0:4> may be replaced by an additional NAND gate, and a capacitor may be installed between the second NAND gates NANDD<0:4> and the additional NAND gates. Accordingly, a replicating delay having a first variation width of a delay amount that depends on a level change of the power supply voltage may be obtained.

Figure 4B:
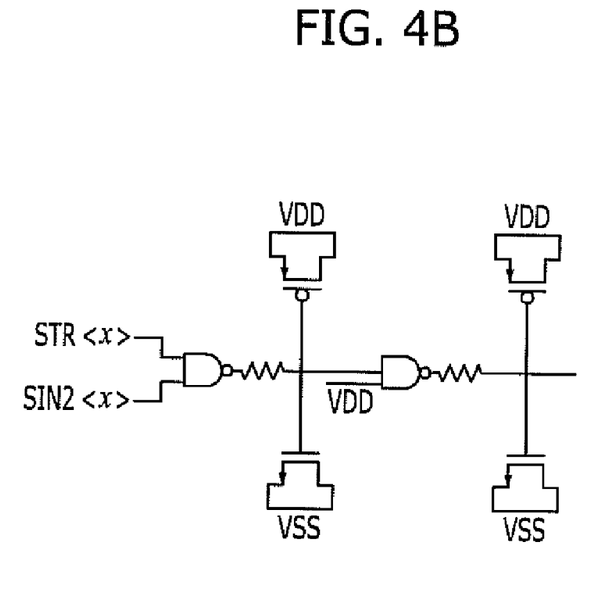

Further, a configuration of the second delay blocks 224<0:4> of the delay units 220<0:4> may be replaced by a configuration shown in FIG. 4B. That is, each of the third inverters INVL<0:4> of the second delay blocks 224<0:4> may be replaced by an additional NAND gate, and a resistor and a capacitor may be installed between the fourth NAND gates NANDL<0:4> and the additional NAND gates. Accordingly, a delay having a second variation width that depends on a level change of the power supply voltage may be obtained.

A detailed operation of the delay line in accordance with the first embodiment of the present application will be described as follows.

Herein, the delay control codes DCON<0:5> have a plurality of bits which bits as a whole represent a value, where in the order of bits from DCON<0> to DCON<5>, each subsequent digit represents a higher valued bit and the first digit DCON<0> represents the least significant bit and the last digit DCON<5> represents the most significant bit in the value of the delay control codes DCON<0:5> as a whole. Thus, where only one bit of the delay control codes DCON<0:5> has a value of "1," an increase of the value of the delay control code DCON<0:5> represents a change of a subsequent bit to "1" with all other bits being equal to "0." A progressive increase of the delay control codes DCON<0:5> from the least value to the highest value represents a progressive change of the delay control codes DCON<0:5> where starting from the first bit DCON<0> of the delay control codes DCON<0:5>, each subsequent bit is changed to "1" with all others being equal to "0" until the most significant bit DCON<5> is changed to "1."

For example, if the value of the delay control codes DCON<0:5> is '000001', as the value of the delay control code decreases, '000001' is sequentially changed to '000010', '000100', '001000', '010000', and '100000'.

Likewise, an increase of the value of the delay control codes DCON<0:5> indicates that a subsequent bit is changed to '1' with the other bits being equal to '0'.

For example, if the binary value of the delay control codes DCON<0:5> is '100000', as the binary value of the delay control code progressively increases, '100000' is sequentially changed to '010000', '001000', '000100', '000010', and '000001' in order.

Now, turning to the operation of the delay line in accordance with the first embodiment of the present application, as the value of the delay control codes DCON<0:5> increases, the number of the first delay blocks 222<0:5> of the delay units 220<0:5> performing a first delay operation increases and the number of the second delay blocks 224<0:5> of the delay units 220<0:5> performing a second delay operation decreases.

Further, as the binary value of the delay control codes DCON<0:5> decreases, the number of the first delay blocks 222<0:5> of the delay units 220<0:5> performing a first delay operation decreases and the number of the second delay blocks 224<0:5> of the delay units 220<0:5> performing a second delay operation increases.

As described above, because the value of the delay control codes DCON<0:5> is changed, if the value of the delay control codes DCON<0:5> is '001000', the first delay unit 220<0> and the second delay unit 220<1> delay the input signal INPUT_SIG using the first delay blocks 222<0> and 222<1>, and the third to fifth delay units 220<2>, 220<3>, and 220<4> delay the input signal INPUT_SIG using the second delay blocks 224<2>, 224<3>, and 224<4>.

Likewise, if the value of the delay control codes DCON<0:5> is '000100', the first to third delay units 220<0>, 220<1> and 220<2> delay the input signal INPUT_SIG using the first delay blocks 222<0>, 222<1> and 222<3>, and the fourth and fifth delay units 220<3> and 220<4> delay the input signal INPUT_SIG using the second delay blocks 224<3> and 224<4>.

As described above, the delay line having delay units 220<0:4> in accordance with the first embodiment of the present application may compensate a variation width of absolute delay amount of the delay line depending on the level change of the power supply voltage by installing the first delay blocks 222<0:4> and the second delay blocks 224<0:4> having a different variation width depending on the level change of the power supply voltage VDD within the delay units 220<0:4> and by determining the delay amount of the delay units 220<0:4> at one of the first and second delay blocks 222<0:4> and 224<0:4> in response to the delay control codes DCON<0:5>.

Accordingly, a modeling delay amount matched to the delay amount of a real operation may be implemented irrespective of the level change of the power supply voltage VDD.

Second Embodiment

Figure 3:
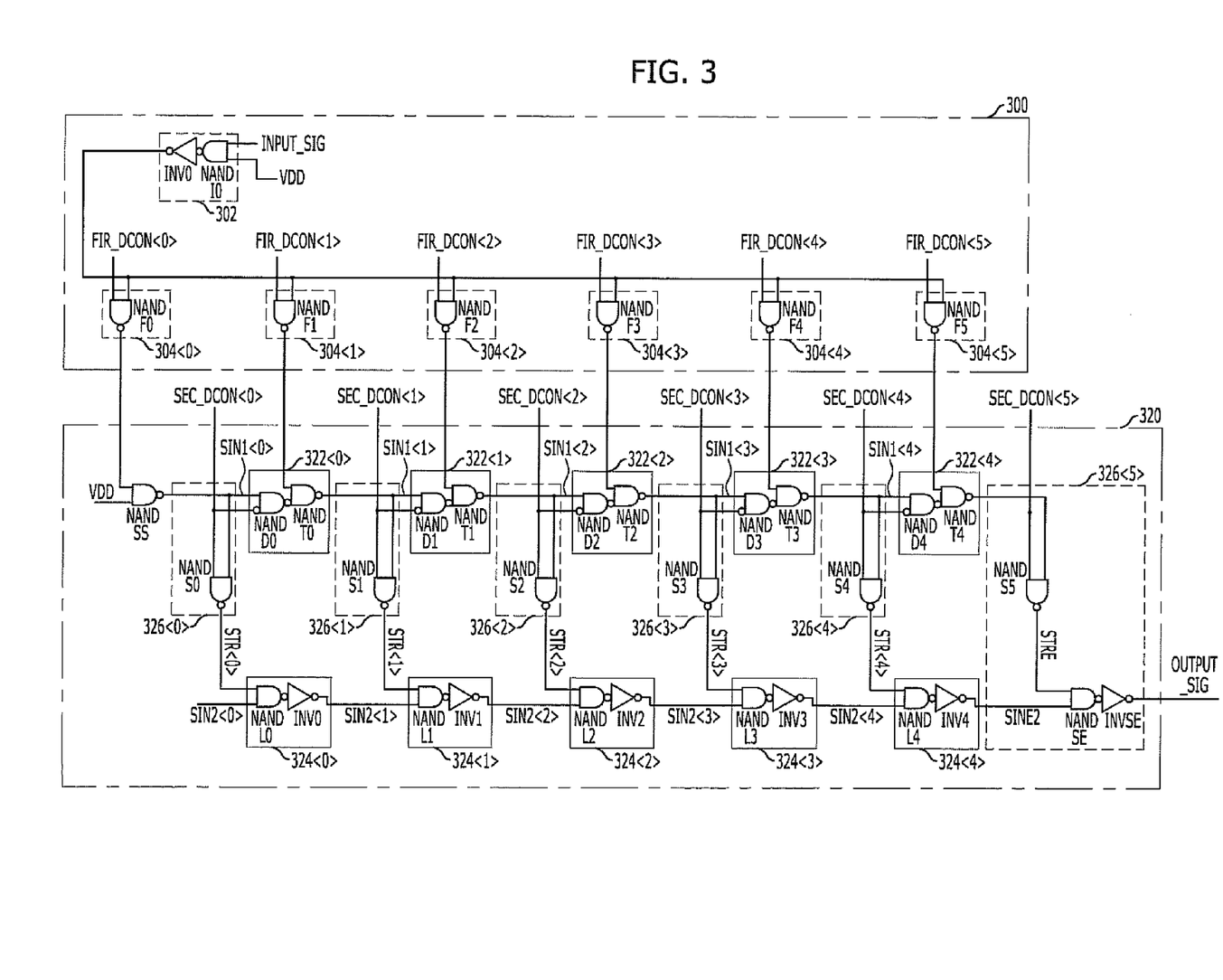
FIG. 3 is a circuit diagram illustrating a delay line for in accordance with a second embodiment of the present application.

FIG. 3 is a circuit diagram illustrating a delay line in accordance with a second embodiment of the present application.

Referring to FIG. 3, a delay line in accordance with a second embodiment of the present application includes a delay amount adjusting unit 300 and a delay unit 320.

The delay amount adjusting unit 300 adjusts a delay amount (a length of a delay path) of an input signal INPUT_SIG by a delay block in response to first delay control codes FIR_DCON<0:5>.

The delay amount adjusting unit 300 includes a buffering block 302 and input signal transfer blocks 304<0:5>.

The buffering block 302 buffers an input signal INPUT_SIG and outputs a buffered input signal. The buffering block includes a first NAND gate NANDI0 and a first inverter INV0. The first NAND gate NANDI0 receives the input signal INPUT_SIG through a first input terminal and a power supply voltage VDD through a second input terminal, and performs a NAND logic operation. The first inverter INV0 inverts and then outputs the output signal of the first NAND gate NANDI0 as the buffered input signal.

The input signal transfer blocks 304<0:5> transfer the buffered input signal to first delay blocks 322<0:4> of the delay unit 320 in response to each of the first delay control codes FIR_DCON<0:5>.

The input signal transfer blocks 304<0:5> each include a second NAND gate NANDF<0:5>. The second NAND gates NANDF<0:5> receive the buffered input signal through a third input node and the corresponding first delay control code FIR_DCON<0:5> through a fourth input node. The second NAND gates NANDF<0:5> then perform a NAND logic operation.

The delay unit 320 determines the number of first delay blocks 322<0:4>, which have a delay amount with a first variation width that depends on the level change of a power supply voltage VDD, and performs a delay operation. The number of second delay blocks 324<0:4>, which have a delay amount with a second variation width that depends on the level change of the power supply voltage VDD, performs a delay operation in response to second delay control codes SEC_DCON<0:5>.

The delay unit 320 includes a third NAND gate NANDSS, the first delay blocks 322<0:4>, the second delay blocks 324<0:4> and delay control blocks 326<0:5>.

The third NAND gate NANDSS receives an output signal of the second NAND gate NANDF0 of the delay amount adjusting unit 300 through a fifth input node and a power supply voltage VDD through a sixth input node, and performs a NAND logic operation.

The first delay blocks 322<0:4> have a delay amount with the first variation width that depends on the level change of the power supply voltage VDD. The first delay blocks 322<0:4> include fourth NAND gates NANDD<0:4> and fifth NAND gates NANDT<0:4>.

The fourth NAND gate NANDD<0> receives an output signal of the third NAND gate NANDSS as a first input signal, while, the remaining fourth NAND gates NANDD<1:4> receive an output signal of the first delay blocks 322<0:3>. However, all of the fourth NAND gates NANDD<0:4> receive an inverted signal of the second delay control codes SEC_DCON<0:4> as a second input signal, and perform a NAND logic operation.

The fifth NAND gates NANDT<0:4> receive an output signal of the input signal transfer blocks 304<1:5> at one input and an output signal of the fourth NAND gates NANDD<0:4> at a second input, and perform a NAND logic operation.

For reference, a configuration of the first delay blocks 322<0:4> may be replaced by a configuration shown in FIG. 4A. That is, a variation width of a delay amount depending on a level change of the power supply voltage may be a first variation width by installing a capacitor between the fourth NAND gates NANDD<0:4> and the fifth NAND gates NANDT<0:4> of the first delay blocks 322<0:4>.

The delay control blocks 326<0:5> determine the number of the first delay blocks 322<0:4> and the number of the second delay blocks 324<0:4> through which the input signal INPUT_SIG passes in response to the second delay control codes SEC_DCON<0:5>.

The delay control blocks 326<0:5> include a start delay controller 326<0>, delay controllers 326<0:4>, and an end delay controller 326<5>.

The start delay controller 326<0> transfers an output signal thereof to the second delay block 324<0> in response to a least significant bit SEC_DCON<0> of the second delay control codes SEC_DCON<0:5>.

The start delay controller 326<0> includes a sixth NAND gate NANDS0. The sixth NAND gate NANDS0 receives the least significant bit SEC_DCON<0> of the second delay control codes SEC_DCON<0:5> at one of its inputs and the output signal of the third NAND gate NANDSS at another of its inputs, and performs a NAND logic operation.

The delay controllers 326<1:4> selectively transfer the output signals of the previous first delay blocks 322<0:3> to the second delay block 324<1:4> in response to the other bits SEC_DCON<1:4> of the second delay control codes SEC_DCON<0:5>.

The delay controllers 326<1:4> include seventh NAND gates NANDS<1:4>. The seventh NAND gates NANDS<1:4> receive the other bits SEC_DCON<1:4> of the second delay control codes SEC_DCON<0:5> at one input and the output signals of the previous first delay blocks 322<0:3> at another input, and perform a NAND logic operation.

The end delay controller 326<5> selectively transfers one of an output signal SINE1 of the first delay block 322<4> and an output signal SINE2 of the second delay block 324<4> in response to the uppermost bit SEC_DCON<5> of the second delay codes SEC_DCON<0:5> to an output terminal.

The end delay controller 326<5> includes an eighth NAND gate NANDS5, a ninth NAND gate NANDSE, and a second inverter INVSE.

The eighth NAND gate NANDS5 receives the uppermost bit SEC_DCON<5> of the second delay control codes SEC_DCON<0:5> at one of its inputs and the output signal SINE1 of the first delay block 322<4> at another of its inputs, and performs a NAND logic operation. The ninth NAND gate NANDSE receives an output signal STRE of the eighth NAND gate NANDS5 at one of its inputs and the output signal SINE2 of the second delay block 324<4> at another of its inputs, and performs a NAND logic operation. The second inverter INVSE inverts and outputs an output signal of the ninth NAND gate NANDSE to the output terminal.

The second delay blocks 324<0:4> each delay an output signal STR<0:4> of the delay control block 326<0:4> or a second input signal SIN2<0:4> by a predetermined delay amount, and output the result.

In detail, the second delay blocks 324<0:4> each include a tenth NAND gate NANDL<0:4> and a third inverter INV<0:4>. The tenth NAND gates NANDL<0:4> receive the output signals STR<0:4> of the delay control blocks 326<0:4> at one input and the second input signals SIN2<0:4> at another input, and perform a NAND logic operation. The third inverters INV<0:4> inverts an output signal of the tenth NAND gates NANDL<0:4>.

According to an exemplary embodiment of the invention, a configuration of the second delay block 324<0:4> may be replaced by a configuration shown in FIG. 4B. That is, each of the third inverters INV<0:4> of the second delay blocks 224<0:4> may be replaced by an additional NAND gate, and a resistor and a capacitor may be installed between the fourth NAND gates NANDL<0:4> and the additional NAND gates. Accordingly, a delay having a second variation width that depends on a level change of the power supply voltage may be obtained.

Hereinafter, the operation of the delay line in accordance with the second embodiment of the present application will be described in detail as follows.

The delay amount adjusting unit 300 decreases a delay amount (a length of delay path) of the input signal INPUT_SIG in response to an increase of a value of the first delay control codes FIR_DCON<0:5>, and increases the delay amount of the input signal INPUT_SIG in response to a decrease of the value of the first delay control codes FIR_DCON<0:5>.

Here, the first delay control codes FIR_DCON<0:5> have a plurality of bits which bits as a whole represent a value, where in the order of bits from FIR_DCON<0:5>, each subsequent digit represents a higher valued bit and the first digit FIR_DCON<0> represents the least significant bit and the last digit FIR_DCON<5> represents the most significant bit in the value of the first delay control codes FIR_DCON<0:5> as a whole. Thus, where only one bit of the first delay control codes FIR_DCON<0:5> has a value of "1," an increase of the value of the first delay control code FIR_DCON<0:5> represents a change of a subsequent bit to "1" with all other bits being equal to "0." A progressive increase of the first delay control codes FIR_DCON<0:5> from the least value to the highest value represents a progressive change of the first delay control codes FIR_DCON<0:5> where starting from the first bit FIR_DCON<0> of the delay control codes FIR_DCON<0:5>, each subsequent bit is changed to "1" with all others being equal to "0" until the most significant bit FIR_DCON<5> is changed to "1."

For example, if the value of the first delay control codes FIR_DCON<0:5> is '100000', as the value increases, '100000' is sequentially changed to '010000', '001000', '000100', '000010' and '000001'.

Likewise, a decrease of the value of the first delay control codes FIR_DCON<0:5> means that a less significant bit has changed to '1', and the other bits are changed to '0'.

For example, if the binary value of the first delay control codes FIR_DCON<0:5> is '000001', as the binary value decreases, '000001' is sequentially changed to '000010', '000100', '001000', '010000', and '100000'.

If the value of the first delay control codes FIR_DCON<0:5> is '001000', the first delay block 322<0>, the second delay block 324<0>, and the start delay controller 326<0>, in response to the two least significant bits FIR_DCON<0:1> in the value of the first delay control codes FIR_DCON<0:5>, do not delay the input signal INPUT_SIG. However, the other first delay blocks 322<1:4>, the other second delay blocks 324<1:4> and the other delay controllers 326<1:4> would delay the input signal INPUT_SIG.

Likewise, if the value of the first delay control codes FIR_DCON<0:5> is '000010', the first delay blocks 322<0:2>, the second delay blocks 324<0:2>, the start delay controller 326<0>, and the delay controllers 326<1:2>, in response to the four least significant bits FIR_DCON<0:3> in the value of the first delay control codes FIR_DCON<0:5>, do not delay the input signal INPUT_SIG. However, the other first delay blocks 322<3:4>, the other second delay blocks 324<3:4>, and the other delay controllers 326<3:4> would delay the input signal INPUT_SIG.

Furthermore, operation of the delay line in accordance with the second embodiment of the present application is also influenced by the second delay control codes SEC_DCON<0:5>. The delay unit 320 increases the number of the first delay blocks 322<0:5> performing a delay operation and decreases the number of the second delay blocks 324<0:5> performing a delay operation in response to an increase of a value of the second delay control codes SEC_DCON<0:5>.

Likewise, the delay unit 320 decreases the number of the first delay blocks 322<0:5> performing a delay operation and increases the number of the second delay blocks 324<0:5> performing a delay operation in response to a decrease of the value of the second delay control codes SEC_DCON<0:5>.

Herein, the second delay control codes SEC_DCON<0:5> represent a plurality of bits, which collectively form the value. Further, an increase of the value of the second delay control codes SEC_DCON<0:5> means that a more significant bit has changed to '1' with the other bits being equal to '0'.

For example, if the value of the second delay control codes SEC_DCON<0:5> is '100000', as the value of the delay control code increases, '100000' is sequentially changed to '010000', '001000', '000100', '000010', and '000001'.

Likewise, a decrease of the value of the second delay control codes SEC_DCON<0:5> means that a less significant bit has changed to '1' with the other bits being equal to '0'.

For example, if the binary value of the second delay control codes SEC_DCON<0:5> is '000001', as the value of the second delay control code decreases, '000001' is sequentially changed to '000010', '000100', '001000', '010000', and '100000'.

If the value of the first delay control codes FIR_DCON<0:5> is '100000' and the value of the second delay control codes SEC_DCON<0:5> is '000010', the first delay block 322<0>, the second delay block 324<0>, and the delay control block 326<0>, in response to the least significant bit FIR_DCON<0> in the value of the first delay control codes FIR_DCON<0:5>, delay the input signal INPUT_SIG. Meanwhile, the other first delay blocks 322<1:4>, the other second delay blocks 324<1:4> and the other delay control blocks 326<1:4> also delay the input signal INPUT_SIG.

Likewise, if the value of the first delay control codes FIR_DCON<0:5> is '100000' and the value of the second delay control codes SEC_DCON<0:5> is '00010', then the first delay block 322<0:2> of the first delay block 322<0:2>, the second delay block 324<0:2> and the delay control block 326<0:2>, in response to the three least significant bits SEC_DCON<0:2> of the second delay control codes SEC_DCON<0:5>, delay the input signal INPUT_SIG. The other first delay blocks 322<3:4>, the other second delay blocks 324<3:4>, and the other delay control blocks 326<3:4> also delay the input signal INPUT_SIG.

As described above, the delay line having delay unit 320 in accordance with the second embodiment of the present application may compensate a variation width of absolute delay amount of the delay line depending on the level change of the power supply voltage by installing the first delay blocks 322<0:5> and the second delay blocks 324<0:5> having a different delay variation width that depends on the level change of the power supply voltage VDD within the delay unit 320 and by determining the delay amount of the delay unit 320 at one of the first and second delay blocks 322<0:5> and 324<0:5> in response to the first delay control codes FIR_DCON<0:5> and the second delay control codes SEC_DCON<0:5>.

Accordingly, a modeling delay amount matched to the delay amount of a real operation may be implemented irrespective of the level change of the power supply voltage VDD.

While the present application has been described with respect to the specific embodiments, it will be apparent to those skilled in the art that various changes and modifications may be made without departing from the spirit and scope of the invention as defined in the following claims.

What is claimed is:

1. A delay line, comprising:
a delay amount adjusting unit configured to adjust a delay amount of an input signal in response to a first delay control code; and
a delay unit configured to determine a number of first delay blocks having a delay amount with a first variation width and a number of second delay blocks having a delay amount of a second variation width in response to a second delay control code,
wherein the delay amount with the first variation width and the delay amount with the second variation width are determined by the delay amount adjusting unit and the first and second variation widths correspond to a level change of a power supply.

2. The delay line of claim 1, wherein the delay amount adjusting unit is configured to increase the delay amount of the input signal in response to an increase of a value of the first delay control code, and decrease the delay amount of the input signal in response to a decrease of the value of the first delay control code.

3. The delay line of claim 2, wherein the first delay control code has a plurality of bits collectively forming the value, and the increase of the value corresponds to a change of a more significant bit of the plurality of bits to '1' and the remaining bits of the plurality of bits to '0'.

4. The delay line of claim 3, wherein the decrease of the value corresponds to a change of a less significant bit of the plurality of bits to '1' and the remaining bits of the plurality of bits to '0'.

5. The delay line of claim 1, wherein the delay unit is configured to increase the number of the first delay blocks and decrease the number of the second delay blocks through which the input signal passes in response to an increase of a value of the second delay control code.

6. The delay line of claim 5, wherein the delay unit is configured to decrease the number of the first delay blocks and increases the number of the second delay blocks through which the input signal passes in response to a decrease of the value of the second delay control code.

7. The delay line of claim 6, wherein the second delay control code has a plurality of bits collectively forming the value, and the increase of the value corresponds to a change of a more significant bit of the plurality of bits to '1' and the remaining bits of the plurality of bits to '0'.

8. The delay line of claim 7, wherein the decrease of the value corresponds to a less significant bit of the plurality of bits being changed to '1' and the remaining bits of the plurality of bits to '0'.

9. A delay line, comprising:
a delay amount adjusting unit configured to adjust a delay amount of an input signal in response to a first delay control code;
a plurality of first delay blocks configured to have a delay amount with a first variation width for the input signal;
a plurality of second delay blocks configured to have a delay amount with a second variation width for the input signal, wherein the first and second variation width correspond to a level change of a power supply voltage and the amount of the second variation width is greater than the amount of the first variation width; and
a plurality of delay control blocks configured to determine a number of the first and second delay blocks through which the input signal passes in response to a second delay control code,
wherein the delay amount with the first variation width and the delay amount with the second variation width are determined by the delay amount adjusting unit.

10. The delay line of claim 9, wherein the delay amount adjusting unit comprises:
a buffering block configured to buffer the input signal and output a buffered input signal; and
a plurality of input signal transfer blocks configured to transfer the buffered input signal to the first delay blocks in response to each bit of the first delay control code.

11. The delay line of claim 10, wherein each of the input signal transfer blocks includes a NAND gate, which receives the buffered input signal and a bit of the first delay control code and performs a NAND logic operation.

12. The delay line of claim 10, wherein each of the first delay blocks is configured to delay and output an output signal of a corresponding input signal transfer block and an output signal of a previous first delay block of the first delay blocks by a predetermined delay amount.

13. The delay line of claim 12, wherein each of the first delay blocks comprises:
a fourth NAND gate configured to receive an output signal of the previous first delay block and an inverted signal of the second delay control code, and to perform a NAND logic operation; and
a fifth NAND gate configured to receive an output signal of the corresponding input signal transfer block and an output signal of the fourth NAND gate, and to perform a NAND logic operation.

14. The delay line of claim 12, wherein the delay control blocks comprise:
a start delay controller configured to transfer the signal outputted from one of the input signal transfer blocks to one of a start first delay block of the first delay blocks and a start second delay block of the second delay blocks in response to a least significant bit of the second delay control code;
a plurality of delay controllers configured to selectively transfer the output signal of the corresponding previous first delay block to the second delay block in response to a plurality of bits of the second delay control code, except for the least significant bit and a most significant bit; and
an end delay controller configured to selectively transfer one of an output signal of one of the first delay blocks and an output signal of one of the second delay blocks in response to the most significant bit of the second delay code to an output terminal.

15. The delay line of claim 14, wherein the start delay controller includes a sixth NAND gate, which receives the least significant bit of the second delay control code and the output signal of a third NAND gate, and performs a NAND logic operation.

16. The delay line of claim 15, wherein each of the delay controllers includes a seventh NAND gate, which receives the plurality of bits of the second delay control code, except for the least significant bit and the most significant bit, and the output signal of the corresponding previous first delay block, and performs a NAND logic operation.

17. The delay line of claim 16, wherein the end delay controller comprises:
   an eighth NAND gate configured to receive the most significant bit of the second delay control code and the output signal of one of the first delay blocks, and to perform a NAND logic operation;
   a ninth NAND gate configured to receive an output of the eighth NAND gate and the output signal of one of the second delay blocks, and to perform a NAND logic operation; and
   a second inverter configured to invert and output an output signal of the ninth NAND gate to an output terminal.

18. The delay line of claim 14, wherein each of the second delay blocks is configured to delay and output an output signal of one of the delay control blocks or a second input signal by a predetermined delay amount.

19. The delay line of claim 18, wherein if the output signals of the delay control blocks are received from the first delay blocks, each of the second delay blocks delays and outputs the output signals of the delay control blocks by the predetermined delay amount, and if the output signal of the delay control block is not received from the first delay blocks, each of the second delay blocks delays and outputs the second input signal by the predetermined delay amount.

20. The delay line of claim 19, wherein each of the second delay blocks comprises:
   a tenth NAND gate configured to receive the output signal of the delay control block and the second input signal, and perform a NAND logic operation; and
   a third inverter configured to invert an output signal of the tenth NAND gate.

21. The delay line of claim 9, wherein the delay amount adjusting unit is configured to increase the number of the first and second delay blocks and the delay control blocks through which the input signal passes in response to an increase of a value of the first delay control code, and to decrease the number of the first and second delay blocks and the delay control blocks through which the input signal passes in response to a decrease of the value of the first delay control code.

22. The delay line of claim 21, wherein the first delay control code has a plurality of bits collectively forming the value, and the increase of the value corresponds to a change of a more significant bit of the plurality of bits to '1' and the remaining bits of the plurality of bits to '0'.

23. The delay line of claim 22, wherein the decrease of the value corresponds to a change of a less significant bit of the plurality of bits to '1' and the remaining bits of the plurality of bits to '0'.

24. The delay line of claim 9, wherein the number of the first delay blocks through which the input signal passes increases and the number of the second delay blocks through which the input signal passes decreases in response to an increase of a value of the second delay control code.

25. The delay line of claim 24, wherein the number of the first delay blocks through which the input signal passes decreases and the number of the second delay blocks through which the input signal passes increases in response to a decrease of the value of the second delay control code.

26. The delay line of claim 25, wherein the second delay control code has a plurality of bits collectively forming the value, and the increase of the value corresponds to a change of a more significant bit of the plurality of bits to '1' and the remaining bits of the plurality of bits to '0'.

27. The delay line of claim 26, wherein the decrease of the value corresponds to a change of a less significant bit of the plurality of bits to '1' and the remaining bits of the plurality of bits to '0'.

28. A delay line, comprising:
   a first delay block configured to delay a first input signal inputted to a first signal input node of a delay unit by a first delay amount in response to a delay control code corresponding to the delay unit, and to transfer a first delayed input signal to a first signal input node of a next delay unit;
   a signal transfer block configured to transfer the first input signal of the first signal input node to a signal transfer node corresponding to the delay unit in response to the delay control code corresponding to the delay unit; and
   a second delay block configured to logically combine an output signal of the signal transfer block transferred to the signal transfer node with a second input signal of a second signal input node, to delay a logically combined signal by a second delay amount, and to transfer a second delayed input signal to a second signal input node of the next delay unit.

29. The delay line of claim 28, wherein the first delay block is configured to delay the first input signal inputted to the first signal input node of the delay unit by the first delay amount, and transfer the first delayed input signal to the first signal input node of the next delay unit in response to an inactivation of the delay control code corresponding to the delay unit.

30. The delay line of claim 29, wherein the first delay block is configured to not transfer the first input signal inputted to the first signal input node of the delay unit in response to an activation of the delay control code corresponding to the delay unit.

31. The delay line of claim 30, wherein the first delay block comprises:
   a second NAND gate configured to receive the first input signal inputted to the first signal input node and an inverted signal of the delay control code corresponding to the delay unit, and to perform a NAND logic operation; and
   a second inverter configured to invert an output signal of the second NAND gate and to transfer an inverted output signal to the first signal input node of the next delay unit.

32. The delay line of claim 31, wherein the signal transfer block is configured to transfer the first input signal of the first signal input node to the signal transfer node corresponding to the delay unit in response to the activation of the delay control code corresponding to the delay unit.

33. The delay line of claim 32, wherein the signal transfer block is configured to not transfer the first input signal of the first signal input node to the signal transfer node corresponding to the delay unit in response to the inactivation of the delay control code corresponding to the delay unit.

34. The delay line of claim 33, wherein the signal transfer block includes a third NAND gate, which receives the first input signal of the first signal input node of the delay unit and the delay control code corresponding to the delay unit, wherein the third NAND gate performs a NAND logic operation, and outputs a result of the NAND logic operation as an output signal of the signal transfer block to the signal transfer node.

35. The delay line of claim 34, wherein the second delay block comprises:

a fourth NAND gate configured to receive the output signal of the signal transfer block and the second input signal, and to perform a NAND logic operation; and a third inverter configured to invert the output signal of the fourth NAND gate and to transfer an inverted signal to the second signal input node of the next delay unit.

* * * * *